United States Patent
Kim

(10) Patent No.: US 6,214,120 B1
(45) Date of Patent: Apr. 10, 2001

(54) HIGH THROUGHPUT MULTI-VACUUM CHAMBER SYSTEM FOR PROCESSING WAFERS AND METHOD OF PROCESSING WAFERS USING THE SAME

(75) Inventor: Seong I. Kim, Northvale, NJ (US)

(73) Assignee: Innovac Corporation, Hoboken, NJ (US)

( * ) Notice: Subject to any disclaimer, the term of this patent is extended or adjusted under 35 U.S.C. 154(b) by 0 days.

(21) Appl. No.: 09/384,231

(22) Filed: Aug. 27, 1999

(51) Int. Cl.[7] .................................................. C23C 16/00
(52) U.S. Cl. .................. 118/719; 118/715; 118/723 VE; 204/298.25
(58) Field of Search ..................... 118/715, 719, 118/723 VE, 723 EB, 723 FE, 723 FI, 726; 204/298.25

(56) References Cited

U.S. PATENT DOCUMENTS

| | | | |
|---|---|---|---|
| 4,636,401 | * 1/1987 | Yamazaki et al. | 118/715 |
| 4,785,962 | 11/1988 | Toshima | 220/260 |
| 5,043,299 | * 8/1991 | Chang et al. | 438/674 |
| 5,851,365 | 12/1998 | Scobey | 204/192.12 |
| 5,855,681 | 1/1999 | Maydan et al. | 118/719 |

* cited by examiner

Primary Examiner—Jeffrie R. Lund
Assistant Examiner—Sylvia R. MacArthur
(74) Attorney, Agent, or Firm—Morgan, Lewis & Bockius LLP

(57) ABSTRACT

An apparatus for processing wafers in the present invention includes first and second processing chambers isolated from each other, an isolation chamber coupled to each processing chamber, a single first type vacuum pump alternatively pumping down the first and second processing chambers through the isolation chamber, wherein the first type vacuum pump can pump down the first processing chamber when a wafer is loaded or unloaded in the second processing chamber, and the first type vacuum pump can pump down the second processing chamber when a wafer is loaded or unloaded in the first processing chamber, a wafer processing source chamber having a wafer processing source, the wafer processing source chamber being coupled to the first and second processing chambers and the isolation chamber, and a plurality of second type vacuum pumps coupled to the first and second processing chambers and the wafer processing source chamber.

21 Claims, 5 Drawing Sheets

✖ CLOSED
OR
OFF

● OPEN
OR
ON

○ IDLING

HIGH THROUGHPUT MULTI-VACUUM CHAMBER SYSTEM FOR PROCESSING WAFERS AND METHOD OF PROCESSING WAFERS USING THE SAME

BACKGROUND OF THE INVENTION

1. Field of the Invention

The present invention relates to an apparatus and method for processing wafers and optical coating, and more particularly, to a high throughput multi-vacuum chamber system for processing wafers and method of processing wafers using the same. Although the present invention is suitable for a wide scope of applications, it is particularly suitable for high wafer throughput, and reduced footprint, thereby providing a low cost of ownership.

2. Description of the Related Art

A wafer process, such as thin film deposition or etching, is generally carried out in a vacuum system. The vacuum system for the wafer process typically consists of vacuum chambers, load lock chambers (or loading door/flange), vacuum pumps, deposition sources, power supplies for the deposition sources, and process control gauges.

A conventional single vacuum chamber system is shown in FIGS. 1A to 1C. A conventional box coater type system shown in FIG. 1A includes a chamber 1, a loading door 2, a pump 3, a valve 4 connecting the chamber 1 and the pump 3, and a deposition source and power supply 5 attached to the chamber 1. FIG.1B shows another conventional system having a chamber 6 with a openable flange 7 for loading wafers. Similar to the box coater system shown in FIG. 1A, the system has a pump 8 and the chamber 6 connected by a valve 9, and a deposition/power source 10. Another type of conventional vacuum system is illustrated in FIG. 1C. This type of system has a load lock chamber 11 attached to a main chamber 12. Wafers (not shown) are transferred to the main chamber 12 through the load lock chamber 11 using a transport arm 13 (or robotic arm). A pump 14 to maintain the system under vacuum condition is connected to the main chamber 12 through a gate valve 15. A deposition/power source 16 is also provided at the bottom of the main chamber 12.

In all of the conventional vacuum systems, however, the wafer process is not able to be performed continuously without breaking the vacuum condition of the chamber when a wafer is loaded or unloaded into the system. As a result, the whole vacuum system including the vacuum pumps is not effectively utilized throughout the process.

Recently, a dual chamber vacuum system for depositing dielectric thin films by plasma-enhanced chemical vapor deposition (PECVD) was discussed in *Vacuum & Thin Film*, November/December 1998, pages 40 to 43. As shown in FIG. 2, the dual chamber compartment shares a common gas supply 21, a pressure control 22, and one vacuum pump 23. Additionally, RF generators 24, a cathode 25, and an anode 26 are provided to generate a plasma in the vacuum system. By using this structure, a small footprint can be configured to process wafers. Also, throughput can be significantly greater than that of the conventional single chamber system.

Nonetheless, there are some problems in the dual chamber vacuum system shown in FIG. 2. For example, although the system shares a common gas supply, a pressure control, and a vacuum pump, it still needs additional deposition sources (i.e. two RF generators). Further, since wafers in the system are processed simultaneously, they cannot be separately prepared if desired. Therefore, the conventional dual chamber vacuum system still has is some drawbacks such as a higher cost of the system and a lesser degree of flexibility in processing.

SUMMARY OF THE INVENTION

Accordingly, the present invention is directed to a high throughput multi-vacuum chamber system for processing wafers and method of processing wafers using the same that substantially obviates one or more of the problems due to limitations and disadvantages of the related art.

Another object of the present invention is to provide a high wafer throughput and reduced footprint, thereby providing a low cost of ownership and reducing labor.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, an apparatus for processing wafers includes first and second processing chambers isolated from each other, an isolation chamber coupled to each processing chamber, a single first type vacuum pump alternatively pumping down the first and second processing chambers through the isolation chamber, wherein the first type vacuum pump can pump down the first processing chamber when a wafer is loaded or unloaded in the second processing chamber, and the first type vacuum pump can pump down the second processing chamber when a wafer is loaded or unloaded In the first processing chamber, a wafer processing source chamber having a wafer processing source, the wafer processing source chamber being coupled to the first and second processing chambers and the isolation chamber, and a plurality of second type vacuum pumps coupled to the first and second processing chambers and the wafer processing source chamber.

In another aspect of the present invention, an apparatus for processing wafers includes first and second processing chambers isolated from each other, an isolation chamber coupled to each processing chamber, a single high vacuum pump alternatively pumping down the first and second processing chambers through the isolation chamber, wherein the high vacuum pump is capable of pumping down the first processing chamber when a wafer is loaded or unloaded in the second processing chamber, and the high vacuum pump is capable of pumping down the second processing chamber when a wafer is loaded or unloaded in the first processing chamber, a wafer processing source chamber having a wafer processing source, the wafer processing source chamber coupled to the first and second processing chambers and the isolation chamber, a plurality of roughing pumps coupled to the first and second processing chambers and the wafer processing source chamber, and a power supply connected to the wafer processing source.

In a further aspect of the present invention, a method of processing wafers includes loading at least one wafer into a first processing chamber, pumping down the first processing chamber and a wafer process source chamber by a high vacuum pump, simultaneously processing at least one wafer in the first processing chamber and loading at least one wafer into a second processing chamber, pumping down the second processing chamber by a roughing pump, increasing the vacuum condition in the second processing chamber without pumping down by any vacuum pumps, unloading at least one wafer from the first processing chamber, and pumping down the second processing chamber and the wafer processing source chamber by the high vacuum pump.

It is to be understood that both the foregoing general description and the following detailed description are exemplary and explanatory only are not restrictive of the invention, as claimed.

BRIEF DESCRIPTION OF THE DRAWINGS

The accompanying drawings, which are incorporated in and constitute a part of this specification, illustrate embodiments of the invention and together with the description, serve to explain the principles on of the invention.

In the drawings.

DETAILED DESCRIPTION OF THE PREFERRED EMBODIMENTS

Reference will now be made in detail to the preferred embodiments of the invention, an example of which is illustrated in the accompanying drawings.

Figure 1A:
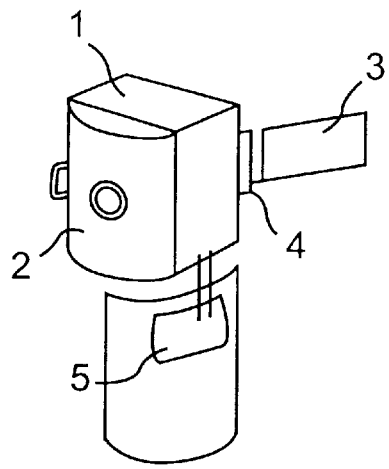
FIGS. 1A to 1C are schematic views of single chamber vacuum systems according to background art.
Figure 1B:
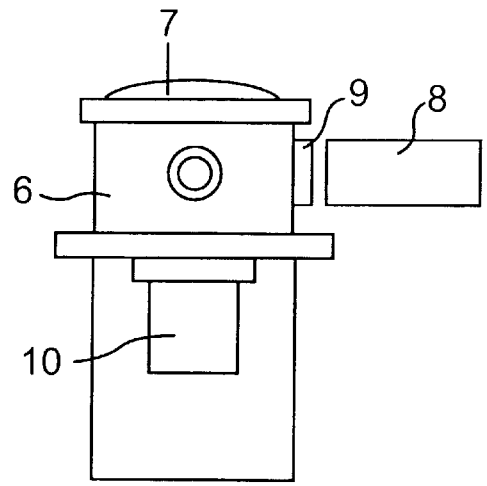
Figure 1C:
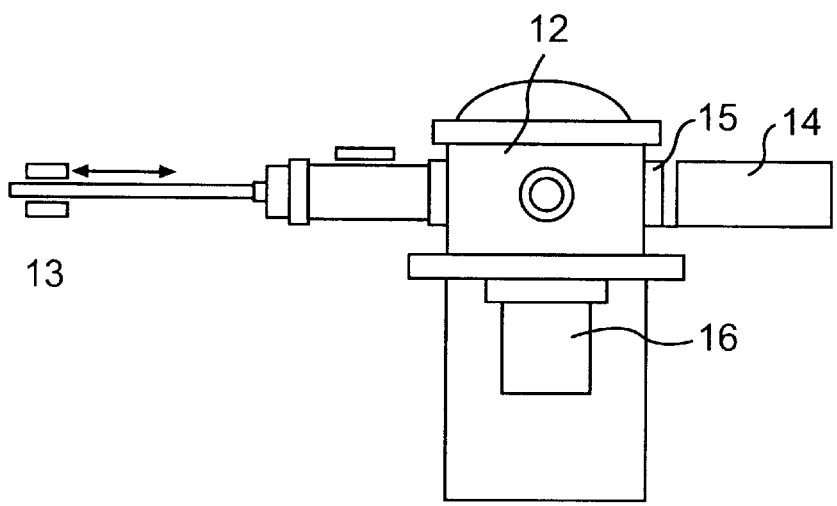
Figure 2:
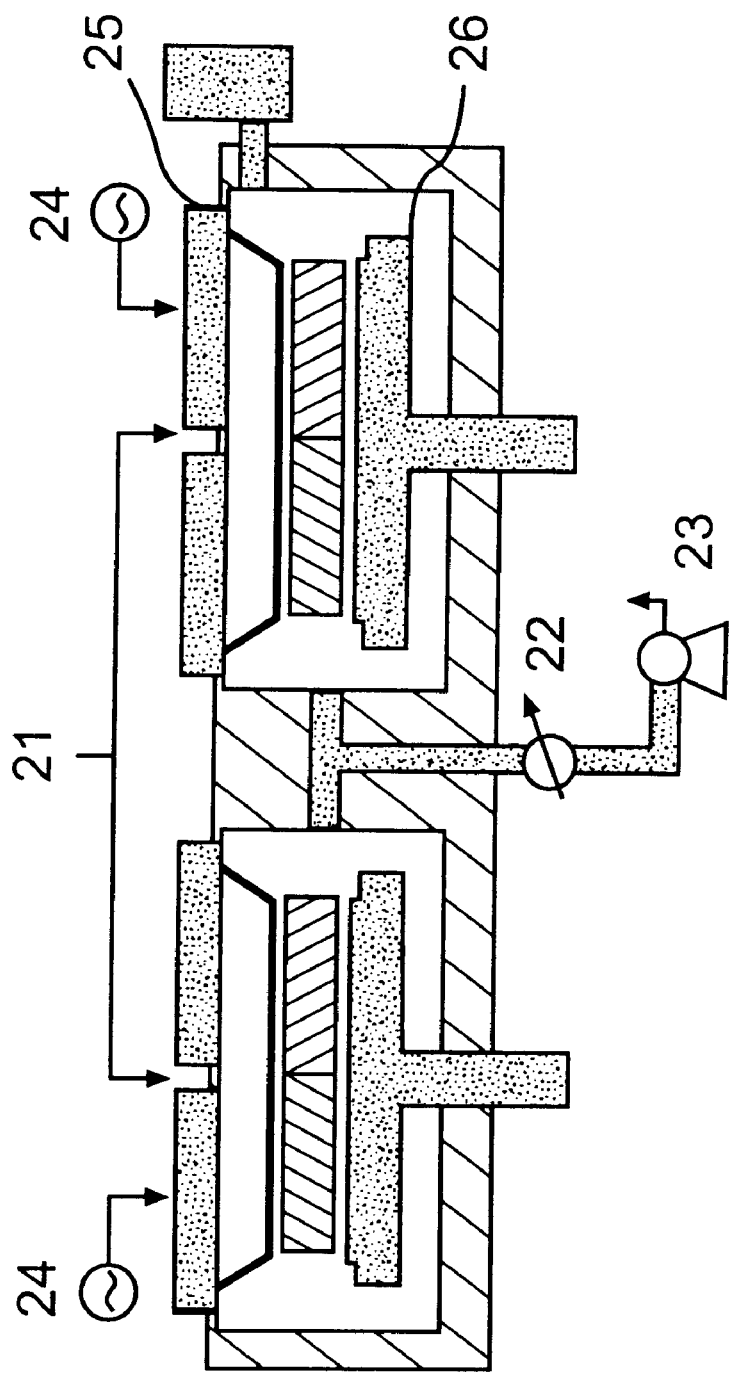
FIG. 2 is a schematic view of a dual chamber vacuum system according to another background art.
Figure 3:
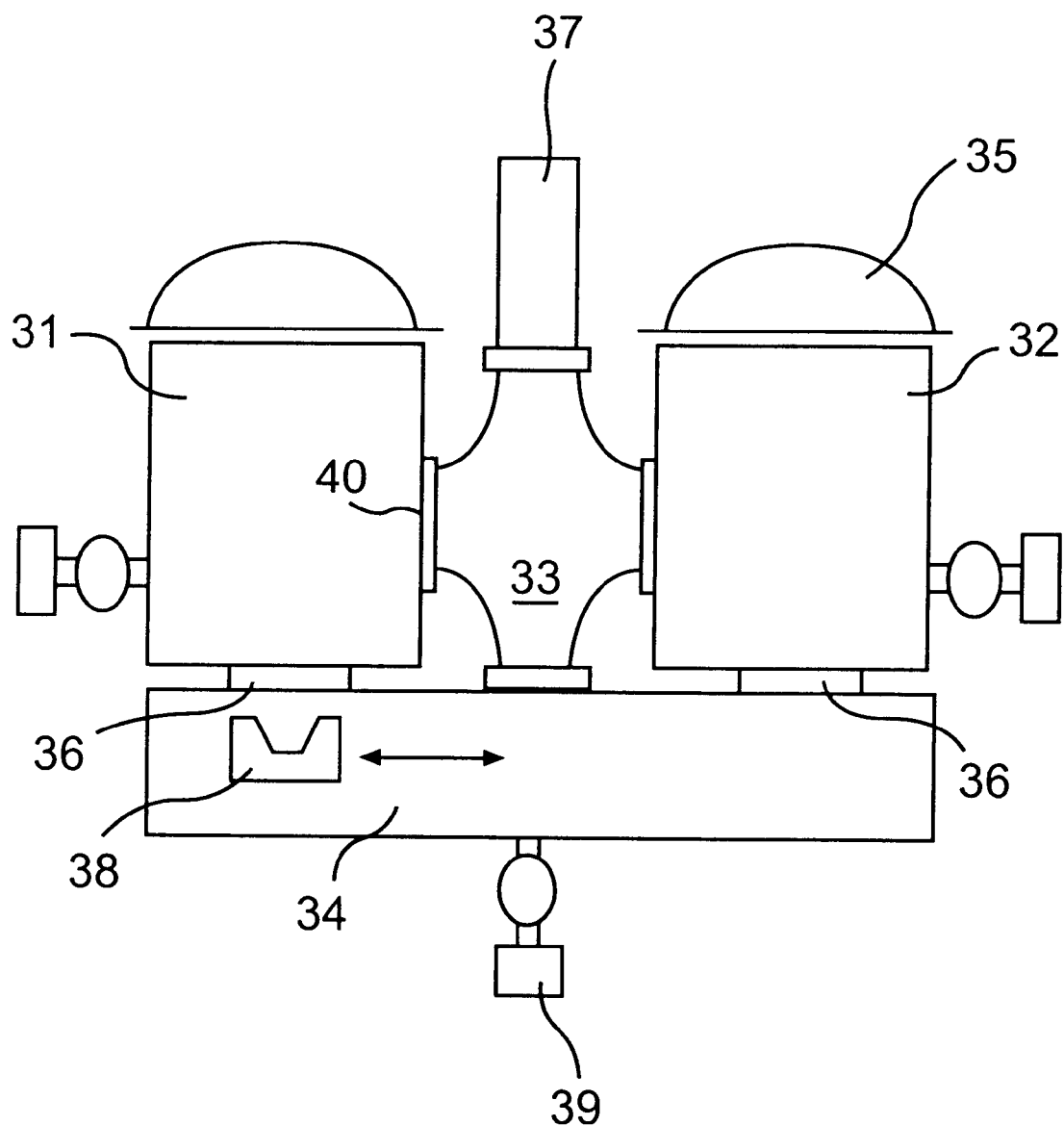
FIG. 3 is a schematic view of a high throughput multi-vacuum chamber system for processing wafers according to the present invention.

FIG. 3 shows a high throughput multi-vacuum chamber system for processing wafers in the present invention. As shown in FIG. 3, the multi-vacuum chamber system consists of first and second processing chambers 31 and 32, an isolation chamber 33 (T-shape) connected between the first and second processing chambers 31 and 32, and a bottom chamber 34 coupled to the first and second processing chambers 31 and 32 and the isolation chamber 33. A chamber door 35 is provided with each processing chamber 31 and 32 to load or unload wafers. Each chamber is connected to the isolation chamber 33 by a gate valve 36. A single high vacuum pump 37 to maintain the system under vacuum condition is attached to the isolation chamber 33. The high vacuum pump 37 is shared by the first and second processing chambers 31 and 32 through the isolation chamber 33 to pump down one or both of the first and second processing chambers 31 and 32. If necessary, both the first and second processing chambers 31 and 32 can be maintained under high vacuum condition (typically, in the range of $1 \times 10^{-4}$ to $1 \times 10^{-7}$ Torr) by the single high vacuum pump 37. A deposition/etching source 38, such as an electron beam source, evaporator, and ion beam source, is located in the bottom chamber 34. The bottom chamber is maintained under a vacuum condition by a roughing pump 39. Additional roughing pumps 39 are also attached to the first and second processing chambers 31 and 32 through a valve 40 in cooperation with the high vacuum pump 37 in order to maintain desirable vacuum condition.

The deposition/etching source 38 may be movable if a liner motion, so that it can be shared by the first and second processing chamber 31 and 32 in processing wafers (not shown).

In this case, the deposition/etching source is separated from each processing chamber through a gate valve.

Alternatively, a separate deposition/etching source can be employed to each processing chamber, so with a single power supply being shared by each deposition/etching source. In this case, a linear motion means for the deposition/etching source and the gate valve are not necessary while an extra deposition/etching source is required. In choosing the alternatives, system design and cost would be factors for consideration.

Figure 4:
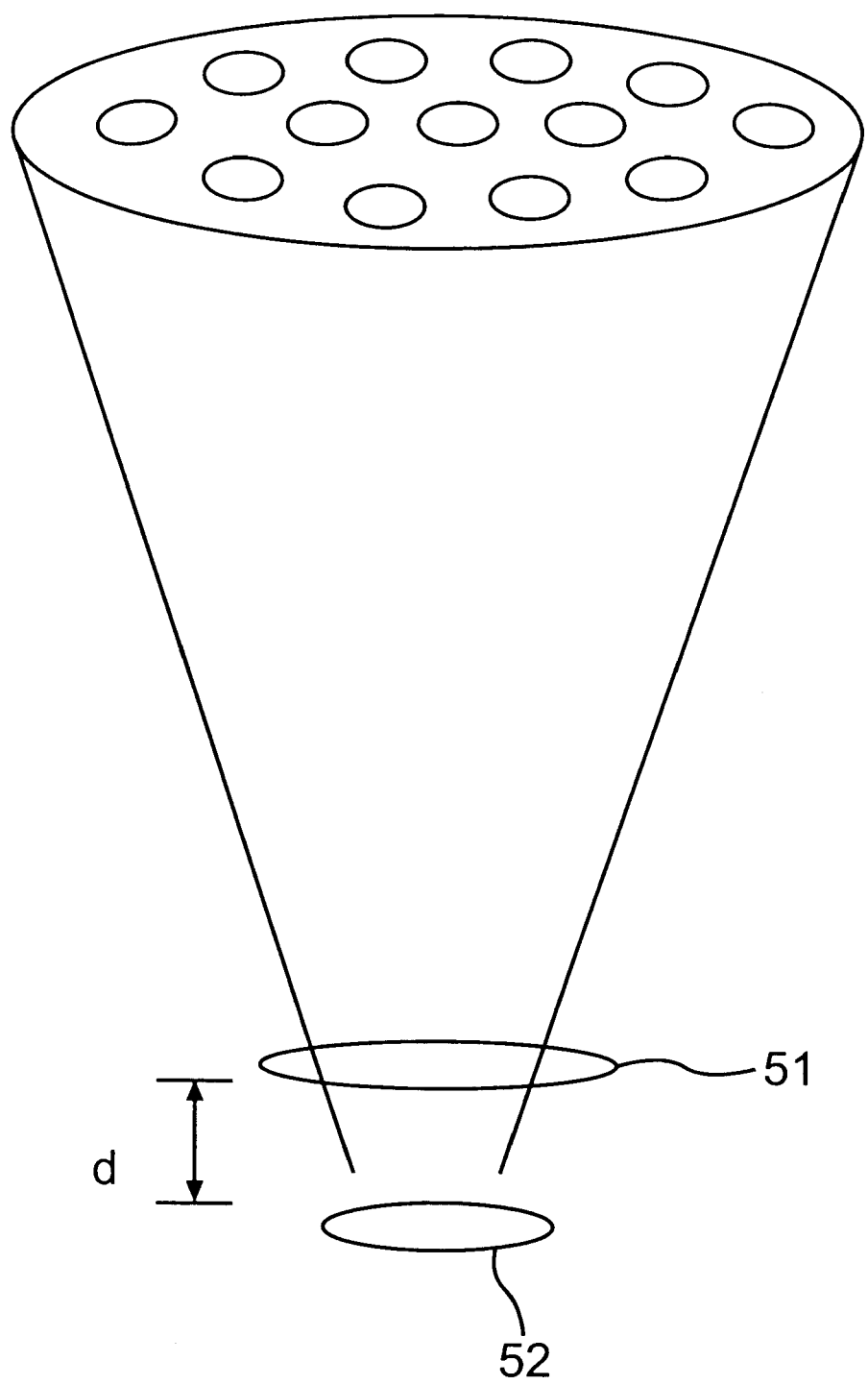
FIG. 4 is a schematic view showing a relation between a size of the gate valve and a distance between the gate valve and the deposition/etching source.

In a preferred embodiment, a size of the gate valve positioned between the deposition/etching source and the main chamber can be reduced by locating the valve near the source. For example, as illustrated in FIG. 4, a size of the gate valve can be reduced when a distance d between a gate valve 51 and a deposition/etching source 52 is decreased. Since a deposition/etching source flies toward wafers to be processed in a cone shape, a smaller gate valve may be installed in controlling the source as the distance d is made shorter.

As described previously in connection with FIG. 3, more than 20 one processing chamber can be operable by sharing a high vacuum pump, a deposition/etching source, and a power supply.

Accordingly, a deposition/etching process in a single chamber may be performed while the wafers in the other chamber are loaded or unloaded.

FIGS. 5A to 5F are schematic views of a method of processing wafers using the system shown in FIG. 3. As shown, the system has a single deposition/etching source which is movable in a liner motion. As described above, the deposition source is separated from each processing chamber through a gate valve.

Figure 5A:
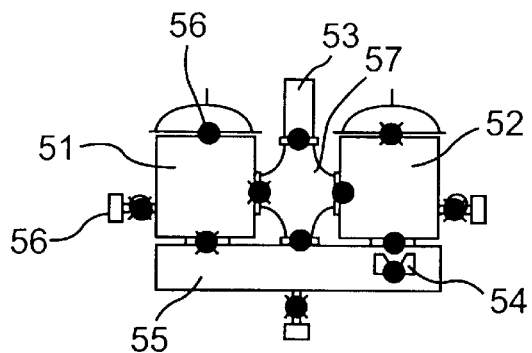
FIGS. 5A to 5F are schematic views of a method of processing wafers using the system shown in FIG. 3.

FIG. 5A illustrates that a deposition/etching process is executed in a second processing chamber 52. A high vacuum pump is pumping down the second processing chamber 52 and a bottom chamber 55. The gate valve between the second processing chamber and the bottom chamber 55 is open, so that a deposition/etching source 54 connected directly to the second processing chamber 52. A first processing chamber 51 is vented by opening gate valves as in shown in FIG. 5A while the deposition/etching process is executed in the second processing chamber 52. Meanwhile, wafers (not shown) are loaded or unloaded in the first processing chamber 51.

Figure 5B:
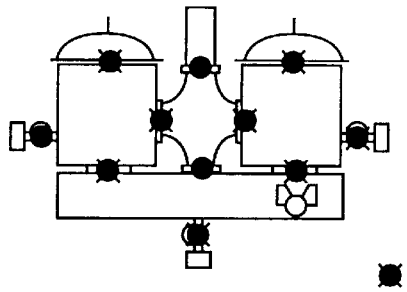

While the deposition/etching process is completed in the second processing chamber 52 in FIG. 5B, the wafers are completely loaded in the first processing chamber 51. By closing the gate valve between the deposition/etching source 54 and the second processing chamber 52, the deposition source 54 is in idling mode, and the first processing chamber 51 is maintained under vacuum condition by a roughing pump 56.

Figure 5C:
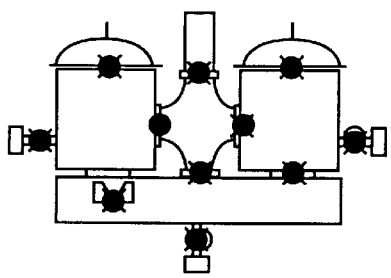

FIG. 5C shows that the first processing chamber 51 is in rough vacuum (in the range of around 10 mTorr) by shutting off the roughing valve and opening up the gate valve between the first processing chamber 51 and an isolation chamber 57. Since the isolation chamber 57 was in vacuum condition higher that the first processing chamber 51, the first processing chamber 51 becomes higher vacuum. In order to prevent a gas shock, the gate valve has to be opened slowly or a separate venting line must be used before opening the gate valve. During this process, the deposition/etching source is moved to the position for processing the wafers in the first process chamber 51.

Figure 5D:
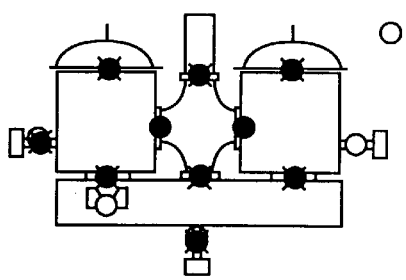
Figure 5E:
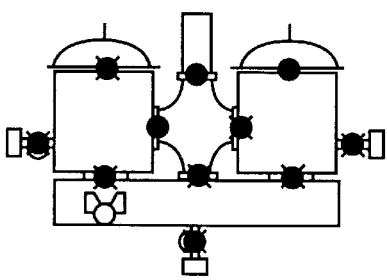

In FIG. 5D, the gate valves between the isolation chamber 57 and the first and second processing chambers 51 and 52 are opened. Thus, the first processing chamber 51 becomes gradually under a higher vacuum condition while the second processing chamber 52 is gradually going to lower vacuum condition. The deposition/etching source 54 is in an idling mode. Subsequently, the second processing chamber 52 is vented to the air Wafers are loaded or unloaded in the second processing chamber 52 in FIG. 5E. The first processing chamber 51 is pumped by the high vacuum pump 53 through the isolation chamber 57. The deposition/etching source 54 is still in an idling mode.

Figure 5F:
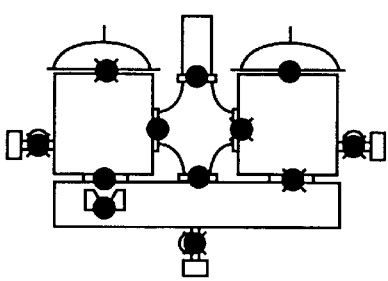

As shown in FIG. 5F, the first process chamber 51 is in the position for processing the wafers by opening the gate valve between the bottom chamber 55 and the first process chamber 51. Wafers in the second process chamber 52 are in the process of being loaded or unloaded. Accordingly, wafers are processed in both the first and second process chambers 51 and 52 by sharing the high vacuum pump 53 and the deposition/etching source 54.

The operational mode illustrated in FIG. 5 is usually for a batch coating mode. In the batch coating mode, a plurality of wafers (batch) are loaded and processed at the same time.

It will be apparent to those skilled in the art that various modifications and variations can be made in the a high throughput multi-vacuum chamber system for processing wafers and method of processing wafers using the same of the present invention without departing from the scope or spirit of the invention. Thus, it is intended that the present invention cover the modifications and the variations of this invention provided they come within the scope of the appended claims and their equivalents.

What is claimed is:

1. An apparatus for processing wafers, comprising:
   first and second processing chambers isolated from each other;
   an isolation chamber coupled to each processing chamber;
   a single first type vacuum pump alternatively pumping down the first and second processing chambers through the isolation chamber, wherein the first type vacuum pump can pump down the first processing chamber when a wafer is loaded or unloaded in the second processing chamber, and the first type vacuum pump can pump down the second processing chamber when a wafer is loaded or unloaded in the first processing chamber;
   a wafer processing source chamber having a wafer processing source, the wafer processing source chamber being coupled to the first and second processing chambers and the isolation chamber; and
   a plurality of second type vacuum pumps coupled to the first and second processing chambers and the wafer processing source chamber.

2. The apparatus according to claim 1, further comprising a power supply for the wafer processing source.

3. The apparatus according to claim 1, wherein the wafer processing source includes at least one of an electron beam source, evaporator, and ion beam source.

4. The apparatus according to claim 1, wherein the first and second processing chambers are coupled to the isolation chamber through gate valves.

5. The apparatus according to claim 1, wherein the wafer processing source chamber is coupled to the first and second processing chambers and the isolation chamber through a plurality of gate valves.

6. The apparatus according to claim 5, wherein the wafer processing source is connected to the first processing chamber when the first type vacuum pump pumps down the first processing chamber.

7. The apparatus according to claim 5, wherein the wafer processing source is connected to the second processing chamber when the first type vacuum pump pumps down the second processing chamber.

8. The apparatus according to claim 1, wherein the wafer processing source is linearly movable so as to be shared by the first and second processing chambers.

9. The apparatus according to claim 1, wherein the wafer processing source includes a separate source connected to each processing chamber.

10. The apparatus according to claim 1, wherein the first type vacuum pump includes a high vacuum pump capable of maintaining a vacuum condition at least in the range of $1\times10^{-4}$ to $1\times10^{-7}$ Torr.

11. The apparatus according to claim 1, wherein the second type vacuum pump includes a roughing pump capable of maintaining a vacuum condition at least in the range of 10 mTorr.

12. An apparatus for processing wafers, comprising:
    first and second processing chambers isolated from each other;
    an isolation chamber coupled to each processing chamber;
    a single high vacuum pump alternatively pumping down the first and second processing chambers through the isolation chamber, wherein the high vacuum pump is capable of pumping down the first processing chamber when a wafer is loaded or unloaded in the second processing chamber, and the high vacuum pump is capable of pumping down the second processing chamber when a wafer is loaded or unloaded in the first processing chamber;
    a wafer processing source chamber having a wafer processing source, the wafer processing source chamber coupled to the first and second processing chambers and the isolation chamber;
    a plurality of roughing pumps coupled to the first and second processing chambers and the wafer processing source chamber; and
    a power supply connected to the wafer processing source.

13. The apparatus according to claim 12, wherein the wafer processing source includes at least one of an electron beam source, evaporator, and ion beam source.

14. The apparatus according to claim 12, wherein the first and second processing chambers are each coupled to the isolation chamber through a gate valve.

15. The apparatus according to claim 14, wherein the wafer processing source is connected to the first processing chamber when the high vacuum pump pumps down the first processing chamber.

16. The apparatus according to claim 14, wherein the wafer processing source is connected to the second processing chamber when the high vacuum pump pumps down the second processing chamber.

17. The apparatus according to claim 12, wherein the wafer processing source chamber is coupled to the first and second processing chambers and the isolation chamber through a plurality of gate valves.

18. The apparatus according to claim 12, wherein the wafer processing source is linearly movable so as to cooperate with the first and second processing chambers.

19. The apparatus according to claim 12, wherein the wafer processing source includes a separate source connected to each process chamber.

20. The apparatus according to claim 12, wherein the single high vacuum pump is capable of maintaining a vacuum condition at least in the range of $1\times10^{-4}$ to $1\times10^{-7}$ Torr.

21. The apparatus according to claim 12, wherein each roughing pump is capable of maintaining a vacuum condition at least in the range of 10 mTorr.

* * * * *